United States Patent
Yudovsky

(12) 
(10) Patent No.: US 6,818,094 B2
(45) Date of Patent: Nov. 16, 2004

(54) RECIPROCATING GAS VALVE FOR PULSING A GAS

(75) Inventor: Joseph Yudovsky, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/354,790

(22) Filed: Jan. 29, 2003

(65) Prior Publication Data

US 2004/0144309 A1 Jul. 29, 2004

(51) Int. Cl.[7] .............................................. H01L 21/306
(52) U.S. Cl. ........................................ 156/345; 257/1
(58) Field of Search ..................... 257/1; 156/345.1; 438/758

(56) References Cited

U.S. PATENT DOCUMENTS

| | | | | |
|---|---|---|---|---|
| 3,960,121 A | * | 6/1976 | Backus ..................... | 123/255 |
| 4,107,008 A | * | 8/1978 | Horvath ..................... | 205/339 |
| 4,176,651 A | * | 12/1979 | Backus ..................... | 123/27 GE |
| 4,436,090 A | * | 3/1984 | Darling ..................... | 128/204.26 |
| 5,038,866 A | * | 8/1991 | Kern et al. ................. | 169/28 |
| 5,298,710 A | * | 3/1994 | Acheson et al. ........... | 219/76.14 |

FOREIGN PATENT DOCUMENTS

WO    WO 02/08488    1/2002    ........... C23C/16/44

* cited by examiner

*Primary Examiner*—John F. Niebling
*Assistant Examiner*—Olivia T. Luk
(74) *Attorney, Agent, or Firm*—Moser Patterson & Sheridan

(57) ABSTRACT

A gas valve for pulsing a gas comprises a housing assembly having at least one inlet port, an outlet port, and a selector plate mounted within the housing assembly and comprising at least one timing slot, wherein reciprocation motion of the selector plate periodically couples at least one inlet port to the outlet port through the timing slot.

22 Claims, 11 Drawing Sheets

RECIPROCATING GAS VALVE FOR PULSING A GAS

BACKGROUND OF THE INVENTION

1. Field of the Invention

The present invention generally relates to semiconductor substrate processing systems. More particularly, the present invention relates to a gas valve for pulsing of one or more gases used in a semiconductor substrate processing system.

2. Description of the Related Art

In cylindrical film processing, for example, atomic layer deposition, atomic layer etch or other repetitive, thin film deposition or etch process, is desirable to provide rapid and precise cycling of process gases to improve the production worthiness of processing systems. In this regard, valves that may reliably inject small amounts of materials at rapid rates are needed. Some current and desired feature cylindrical layer deposition processes will require injection sequences wherein a single pulse may be as short as a few tens of milliseconds and be separated from an adjacent pulse by a few tens of milliseconds. Providing such pulses of gas using conventional solenoid or pneumatically operated valves have not proven desirable for this use due to insufficient responsiveness, i.e., long cycle times, failure to shut off cleanly, high rate of particulate generation and poor reliability and short service life. These deficiencies lead to suboptimal physical properties of the positive films, short service life and high maintenance frequencies.

Therefore, there is a need for a valve for pulsing gas during cylindrical processes such as atomic layer deposition and the like.

SUMMARY OF THE INVENTION

The present invention is a reciprocating gas valve for pulsing gases (or gas mixtures). The inventive gas valve comprises a plurality of gas inlet ports and one gas outlet port that are periodically engaged in fluid communication by a reciprocating selector plate. The selector plate comprises at least one timing slot to establish and terminate a flow of each gas (or gas mixture). In one embodiment, the inventive gas valve produces pulses having a duration of about 50 to 300 msec of three gases. In one application, the invention is used for pulsing reactive precursor and purge gases during an atomic layer deposition process performed in a semiconductor substrate processing system.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only typical embodiments of this invention and are therefore not to be considered limiting of its scope, for the invention may admit to other equally effective embodiments.

DETAILED DESCRIPTION

The present invention is a reciprocating gas valve for pulsing one or several gases (or gas mixtures) to form a sequence of pulses of the gas. Herein the terms gas and gas mixture are used interchangeably. The gases are supplied to the gas valve in a non-pulsed form, as a plurality of individual pressurized gases. The gas valve comprises a plurality of gas inlet ports and one gas outlet port. The gas inlet ports are sequentially engaged with the gas outlet port in fluid communication by a reciprocating selector plate. The selector plate comprises at least one timing slot. When the selector plate is engaged in a reciprocating motion, the timing slot periodically establishes and terminates a flow from the gas outlet port of each gas that is plumbed to the gas valve. As such, the reciprocating motion of the selector plate results in pulsing of the gas. In one exemplary application, the invention is used for pulsing of gases (e.g., both reactant and purge gases) during a cyclical deposition process such as an Atomic Layer Deposition (ALD) process that is performed in a semiconductor substrate processing system.

Figure 1:
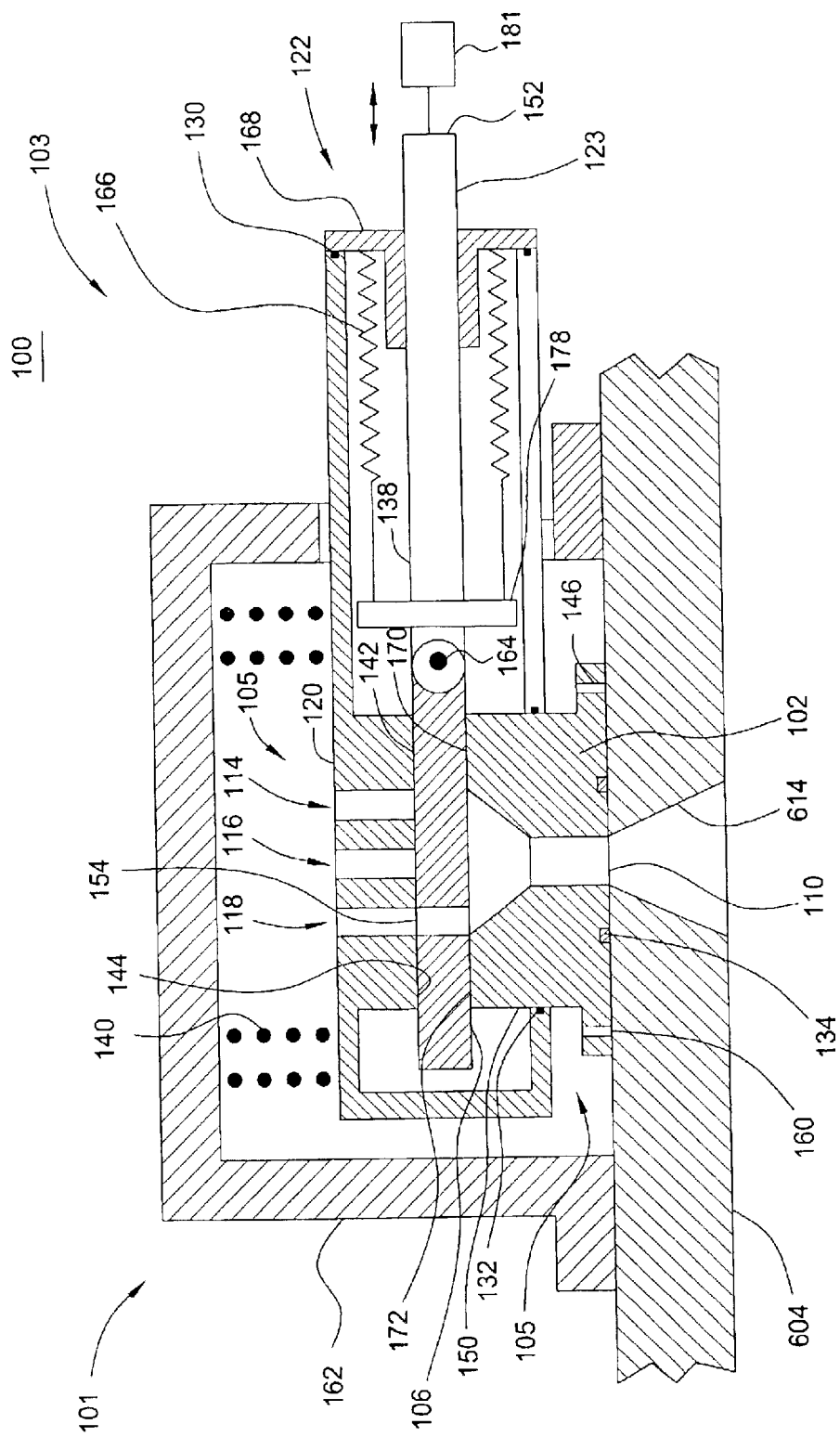
FIG. 1 is a schematic, cross-sectional view of a gas valve in accordance with one embodiment of the present invention.
Figure 2:
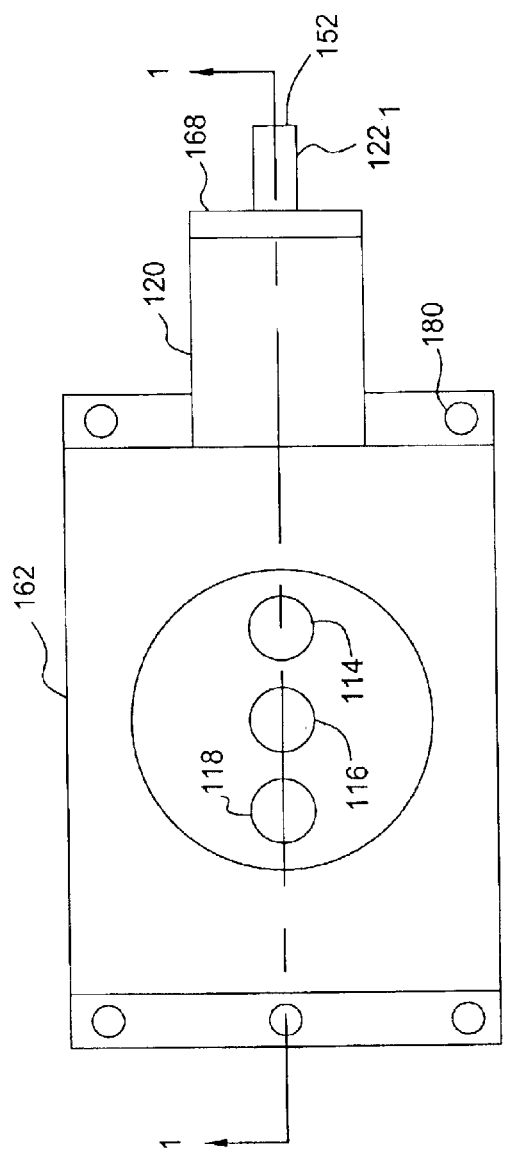
FIG. 2 is a schematic, top plan view of the gas valve of FIG. 1.
Figure 7:
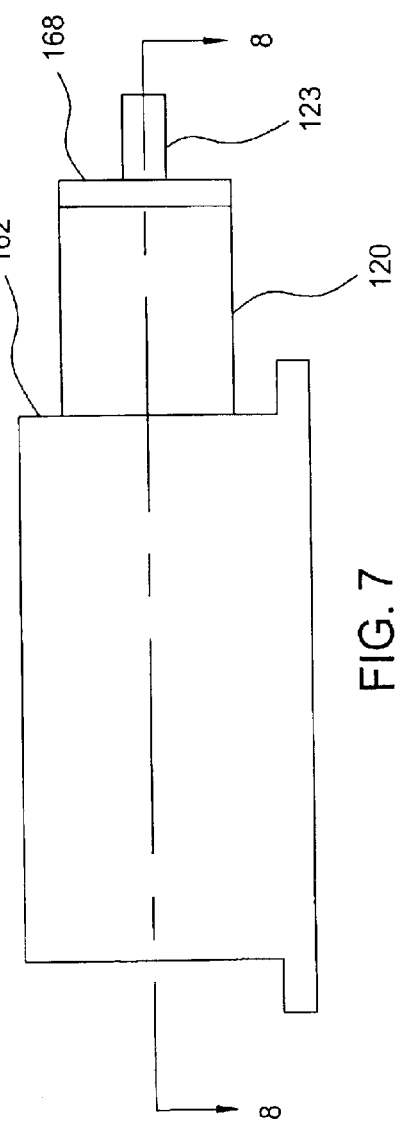
FIG. 7 is a schematic, side view of the gas valve of FIG. 1.
Figure 3:
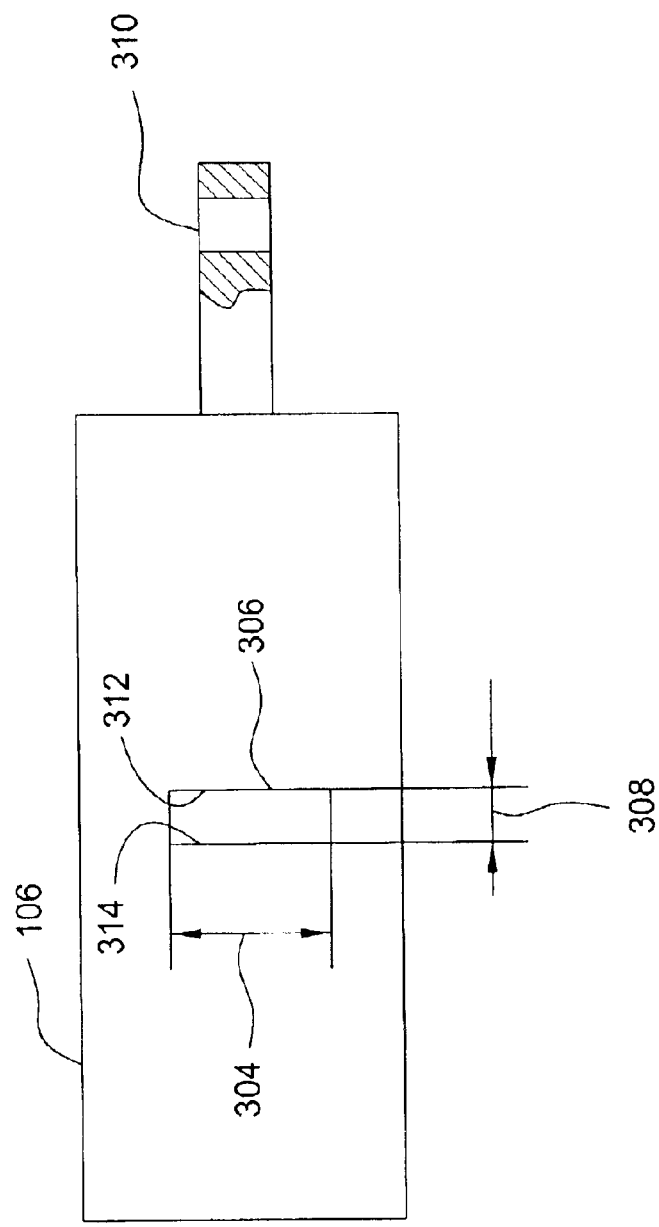
FIG. 3 is a top plan view of one embodiment of a reciprocating selector plate of the gas valve of FIG. 1.
Figure 8:
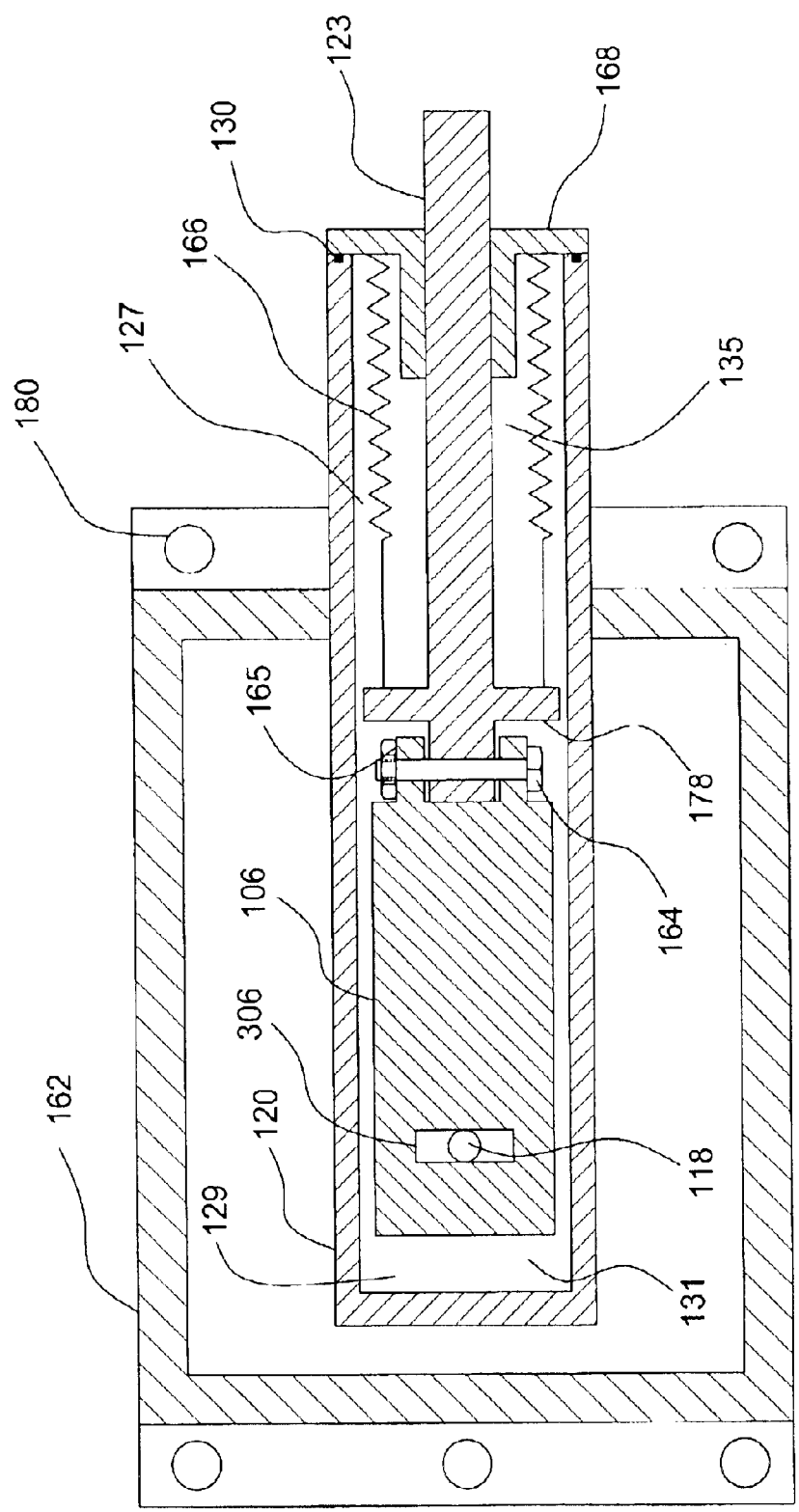
FIG. 8 is a schematic, top cross-sectional view of the gas valve of FIG. 1.

FIG. 1 and FIG. 2 are, respectively, schematic, cross-sectional and top plan views of a reciprocating gas valve 100 in accordance with one embodiment of the present invention. The cross-sectional view in FIG. 1 is taken along a centerline 1—1 in FIG. 2. FIG. 3 is a schematic, top plan view of one embodiment of a selector plate 106. Further, FIG. 7 is a schematic, side view of the valve 100, while FIG. 8 is a schematic, top cross-sectional view of the valve 100 taken along a centerline 8—8 in FIG. 7. For best understanding of this embodiment of the invention, the reader should refer simultaneously to FIGS. 1–3, 7, and 8. The images in FIGS. 1–3, 7, and 8 are simplified for illustrative purposes and not depicted to scale.

The reciprocating gas valve 100 comprises a valve housing assembly 103 and a bracket assembly 101. In one embodiment of the invention, the valve housing assembly 103 comprises a first portion 105 and a second portion 107. The bracket assembly 101 comprises a supporting bracket 162 and a bias member (e.g., a spring) 140.

The first portion 105 defines the inlet ports 114, 116, and 118 that form inlet ports for the valve, cavities 127 and 129, and comprises a housing 120 and an actuator assembly 122. The actuator assembly 122 comprises a shaft 123, a flange 178, a reciprocating selector plate 106, a pivot 164, a bellow 166, and a retainer ring 168.

The second portion 107 comprises a valve body 102 that defines a valve chamber 108, an outlet port 110, and comprises a flange 146.

The flange 146 and the supporting bracket 162 are provided with openings 160 and 180, respectively, for mounting, generally by using bolts or screws, the valve 100 and the bracket 162 upon a gas receiving assembly. The gas receiving assembly comprises apparatus that utilizes the pulsed gases. One embodiment of such an apparatus is a semiconductor wafer processing chamber that is disclosed below with respect to FIG. 6.

The outlet port 110 couples the valve chamber 108 to the gas receiving assembly. In one embodiment, the valve chamber 108 has an internal volume in a range of about 1 to 3 $cm^3$ or less. A small internal volume of the valve chamber 108 can be gas pressurized rapidly. As such, the valve 100 can produce pulses of gas rapidly, i.e., at a high rate, and the pulses, which comprise substantially sharp leading and trailing edges.

In the depicted embodiment, the housing 120 comprises three gas channels 114, 116, and 118. Each gas channel is adapted for passing of one gas through the first portion 105 to the selector plate 106. In an alternative embodiment, the number of channels may be either less or greater than three. Each gas channel has an inlet 153 and an outlet 154.

Generally, a gas channel has a substantially circular form factor. An axis of the gas channel may form either a right angle (as depicted in FIG. 1 and FIG. 2) or any other angle with the inner surface 144 of the housing 120. The outlet 154 of each channel 114, 116, and 118 may have various form factors such a circular, a rectangular, an oval, and the like. In one embodiment, outlets 154 of the gas channels 114, 116, and 118 are positioned along a line that is substantially parallel to a direction of a reciprocating motion performed by the selector plate 106, for example, along a centerline of the selector plate 106. Further, in one embodiment, the outlets of the outer gas channels 114 and 118 are positioned about symmetrically with respect to the outlet of the gas channel 116, while the outlet of the gas channel 116 opposes the central region of the valve chamber 108 and outlet port 110.

The inlet 153 of each channel 114, 116, and 118 may be adapted to provide a vacuum-tight coupling (not shown) to an external gas line 612 (discussed in reference to FIG. 6 below) that delivers a respective gas to the inlet of the gas channel. The inlet 153 may, for example, be welded to the external gas line or comprise a sealing element, such as at least one vacuum-grade O-ring, a vacuum-tight fitting, and the like. Other forms of vacuum couplers may be used to connect the channels to various gas suppliers. The vacuum-grade O-ring generally is formed from a polymeric material such as synthetic or natural rubber, a metal or metal alloy, and the like. Furthermore, the inlet may additionally comprise a vacuum-tight shut-off valve to isolate a gas channel from the external environment when the gas channel is not used during a specific deposition process, e.g., the ALD process.

The valve body 102 comprises a seal 134 and the housing 120 comprises seals 130 and 132. The seals protect the interior of the valve 100 from the external environment. The seal 134 and 130 are static seals. The seal 134 provides a vacuum-tight coupling between the valve body 102 and the gas receiving assembly, while the seal 130 provides a vacuum-tight coupling between the housing 120 and the retainer ring 168. The seal 132 is a sliding seal that provides a vacuum-tight coupling between the housing 120 and an outer surface 150 of the valve body 102 during the sliding motion or stationary positioning of the first portion 105 upon the second portion 107 of the housing assembly 103. In one embodiment, each of the seals 130, 132, and 134 comprises at least one vacuum-grade O-ring and a slot or groove for receiving the O-ring. In an alternative embodiment, at least one of the seals 130, 132, and 134 may be a pumped or double-pumped seal.

The shaft 123 is disposed in a guide 126 in the retainer ring 168. A first end 152 of the shaft 123 is coupled to a linear drive (e.g., motor 181) that applies a reciprocating motion to the shaft. In one embodiment, the linear drive may comprise a controlled a linear stepper motor, a solenoid, and the like. A second end 138 of the shaft 123 is located in the cavity 127 of the first portion 105 and comprises a flange 178. The second end 138 of the shaft is coupled to a first end 117 of the selector plate 106 using the pivot 164 (e.g., a screw or bolt having a lock-nut 165 and the like). In operation, the shaft 123 facilitates a reciprocating motion of the selector plate 106 and defines a longitudinal position of the timing slot 306 with respect to each of the outlets 154 of the gas channels 114, 116, and 118. A second end 119 of the selector plate 106 extends into the cavity 129, wherein a guaranteed gap 131 is defined between the plate and an opposing wall 133 of the cavity for any position of the plate 106. In one embodiment, the cavity 129 is further coupled to a source (not shown) of a gas that is neutral to a process that is performed in the deposition chamber 601 (discussed in reference to FIG. 6 below) and, as such, to minimize a difference in the gas pressure in the valve 100 and in the chamber.

The flange 178 is generally affixed to the shaft 123. The opposing ends of the bellow 166 are terminated in a manner that one end forms a vacuum-tight coupling with the flange 178, while the other end forms a similar coupling with the retainer ring 168. As such, the bellow 166 defines a sealed cavity 135, while allowing the shaft 123 to reciprocate. In operation, the sealed cavity 135 absorbs any particles generated by the shaft 123 and prevents the particles from entering a gas stream in the valve 100.

Referring to FIG. 1, the bias member 140 may comprise at least one concentric spring or a plurality of smaller springs disposed between the housing 120 and the supporting bracket 162 around the inlet ports of the gas channels 114, 116, and 118. The supporting bracket 162 compressively preloads the bias member 140. When preloaded, the bias member 140 exerts an expanding elastic force applied to the housing 120. Such force causes the housing 102 to slide down the surface 150 of the valve body 102 until the selector plate 106 becomes uniformly compresses between the opposing outer surface 172 of the valve body 102 and inner surface 144 of the housing 120. Specifically, the elastic force of the bias member 140 pushes the upper surface 142 of the selector plate 106 against the inner surface 144 of the housing 120 and the lower surface 170 of the selector plate 106 against the upper surface 172 of the valve body 102.

The surfaces 144 and 142 and surfaces 170 and 172 are flat surfaces that are formed in a manner that, when pushed against each other by the elastic force of the bias member 140, they form sliding, vacuum-tight compressive seals between the solid portions of the surfaces. Further, in operation, the seals isolate the outlets of the gas channels from one another and from the valve chamber 108. In operation, the seals also isolate from the valve chamber 108 the gas channels that momentarily do not coincide with the timing slot 306. In one embodiment, sealing contacts between the surfaces 142 and 144 and surfaces 170 and 172 are formed using fine machining of the surfaces (e.g., using plane-parallel polishing and the like).

The parts of the valve 100 may be exposed to a chemically aggressive gases, e.g., a reactive precursor gas used during a cyclical deposition process, generally are fabricated from or coated with chemically resistant materials that do not substantially react with such gases. In one embodiment, examples of such chemically resistant materials comprise polytetrafluoroethylene (PTFE), polychlorotriflouroethylene (PCTFE), perfluoroalkoxy (PFA), polyimide, and the like. In other embodiments, may be used materials such as ceramic, a metal, a metal alloy, and the like.

In some applications, during a deposition process, the valve body 102 is maintained at a temperature of about 90 degrees Celsius to prevent condensation of the gas(es) inside the valve. One of materials that is resistant, at such temperatures, to many conventional reactant gases (e.g., comprising ammonia ($NH_4$)) is polyimide VESPEL® CR-6100, which is available from DuPont Company, Wilmington, Del.

Referring to FIG. 3, the selector plate 106 comprises at least one timing slot 306 and an opening 310 for the pivot 164. In other embodiments, the selector plate 106 may comprise a plurality of individual timing slots wherein each timing slot is formed, disposed, and operates similar to the slot 306. In one embodiment, the timing slot 306 has a form factor that allows the slot to coincide with the outlet 154 or overlap the outlet during the reciprocating motion of the selector plate 106. In operation, the timing slot 306, in a cyclical order, sequentially passes the outlets of the gas channels.

When the timing slot 306 momentarily coincides with the outlet 154 of a gas channel 114, 116, or 118, the gas provided to that channel may freely flow through the timing slot 306 into the valve chamber 108 and to the outlet port 110. As such, when the timing slot 306 coincides with the outlet, the selector plate 106 establishes a momentary state of fluid communication between the inlet of the respective gas channel and a recipient port for the pulsed gas.

In general terms, the form factors and positions of the outlets 154 are selected to provide best conductance in a gas path comprising an outlet and the timing slot 306. In one embodiment, the timing slot 306 has a width 308 that is about a width of the outlet 154 as measured in a direction of the reciprocating motion the plate 106. Alternatively, the timing slot 306 may have the width 308 that is either greater or less than the width of the outlet 154. In the depicted embodiment, the slot is substantially an accurate rectangular. Other shapes of the timing slot may also be use, e.g., square, circular, rectangular, and the like. In a further embodiment, the timing slot 306 may also be disposed in the selector plate 106 at an angle other than the right angle to the direction of traveling of the plate. Further, edges 312 and 314 of the timing slot 306 may be profiled (not shown). In one embodiment, the edges 312 and 31 have outward directed slopes, i.e., the timing slot 146 has a width on the lower surface 170 that is greater than the width 308 of the slot on the upper surface 142. As such, in operation, the timing slot 306 can facilitate a predetermined rate of changes in a gas flow through the valve loop e.g., smooth transition between the ON and OFF period (discussed in reference to FIGS. 5A–B below).

When the timing slot 306 reciprocates, it periodically establishes and terminates a flow of gas from the gas channel it passes. As such, the motion of the selector plate 306 forms a pulse of gas from that gas channel into the valve chamber 108. From the valve chamber 108, the pulse of gas may propagate through the outlet port 110 into a recipient port for the pulsed gas.

Similarly, a continued reciprocating motion of the timing slot 306 creates a pulse of gas from the adjacent gas channel in the direction of the motion or, specifically, from the gas channel having an outlet positioned adjacent the outlet of the previously passed gas channel. In operation, the timing slot 306 periodically couples a gas channel and the valve chamber 108 and such coupling creates a pulse of gas from that channel of the valve 100. A number of pulses increases per unit of time as the selector plate 106 reciprocates faster.

In one embodiment, the width 308 of the timing slot 306 may be less than a distance between the outlets of the adjacent gas channels. In this embodiment, when the selector plate 106 reciprocates, the entire timing slot 306 becomes momentarily positioned between the outlets of the gas channels such that none of the channels is currently in fluid communication with the slot. A period of time from a moment when the timing slot 306 terminates a flow of gas from a preceding gas channel to a moment the slot 306 begins establishing of the flow of gas from the adjacent gas channel relates to a cutoff period between the pulses of gases (discussed in reference to FIG. 5A below). Thus, a time duration can be established wherein no gas flows to the output port 110.

In an alternative embodiment, a length 304 of the timing slot 306 may be greater than a distance between the adjacent gas channels. In this embodiment, as the selector plate 106 reciprocates, the timing slot 306 may begin coinciding with a position of an outlet of the next gas channel prior to termination of flow of the gas from the preceding gas channel. Such position of the timing slot 306 relates to a momentary state of simultaneous fluid communication between the adjacent gas channels and the valve chamber 108. Such a state results in overlapping of pulses of gases from the adjacent channels (discussed in reference to FIG. 5B below).

In operation, the timing slot 306 sequentially connects the outlets of the gas channels 114, 116, and 118 to the valve chamber 108. A duration of connection relates to a duration of a pulse of gas from a respective gas channel. The duration of the pulse is $T_1=(L_{TS}+L_O)/V$, where V is an average velocity at which the timing slot 306 passes the outlet 154, $L_{TS}$ is a width of the slot 306, and $L_O$ is a width of the outlet 154. Similarly, a duration of a cutoff period between pulses from the same gas channel is $T_2=L_{DT}/V-T_1$, where $L_{DT}$ is a travelling distance of the timing slot 306 (or selector plate 106).

A pulse of gas from the gas channel M that is positioned adjacent the gas channel N along the traveling path of the selector plate 106 begins after expiration of a period $T_3=V/(\Delta L_{MN}-L_{TS})$, where $\Delta L_{MN}$ is a distance between the channels N and M. When the gas channels are evenly disposed along the traveling path, all distances between adjacent channels are equal to $\Delta L$ (i.e., $\Delta L_{MN}=\Delta L$) and $T_3=C/(\Delta L-L_{TS})$.

The period $T_3$ may have either a positive value (i.e., $T_3>0$) or at least one of the periods $T_3$ may have a negative value (i.e., $T_3<0$). A positive value of $T_3$ relates to an embodiment having a gas cutoff period between pulses from the adjacent channels N and M (discussed in reference to FIG. 5A below). A duration of the gas cutoff period is $T_3$. Similarly, a negative value of $T_3$ relates to an embodiment when pulses from the adjacent channels N and M may overlap one another (discussed in reference to FIG. 5B below).

When a travelling distance $L_{DT}$ of the timing slot 306 is greater than $L_1=L_{OUT}+L_{TS}+L_O$ the slot 306 forms two separate pulses from each of the outer channels 114 and 118. Here $L_{OUT}$ is a distance between the gas channels 114 and 118. The pulses from the outer channels are separated by a single pulse from the inner channel 116. When the traveling distance $L_{DT}$ is shorter or equal $L_1$, the timing slot 306 forms a single pulse from each outer gas channel.

During a reciprocating motion, velocity of the timing slot 306 typically varies along the traveling path, e.g., by the timing slot 306 generally passes the outlet of the inner gas channel 116 slightly faster than the outlets of the gas channels 114 and 118. Such difference in the velocity, i.e., a velocity profile, may result in differences in a duration of the pulses and in an amount of gas in the pulses from the respective gas channels.

When all pulses of gas should have the same duration or the same amount of gas, the gas pressure or conductance of the gas channels 114, 116, and 118 may be adjusted to compensate for higher velocity of the slot passing the center channel. In one embodiment, such adjustments are applied to the gas channel 116. Specifically, in this embodiment, the gas pressure or conductance of the gas channel 116 is increased with respect to channels 114 and 118. Alternatively, the traveling distance $L_{DT}$ may be increased or a velocity of the selector plate 106 may be modified to compensate for the velocity profile of the slots, as discussed below in reference to FIG. 4.

Figure 4:
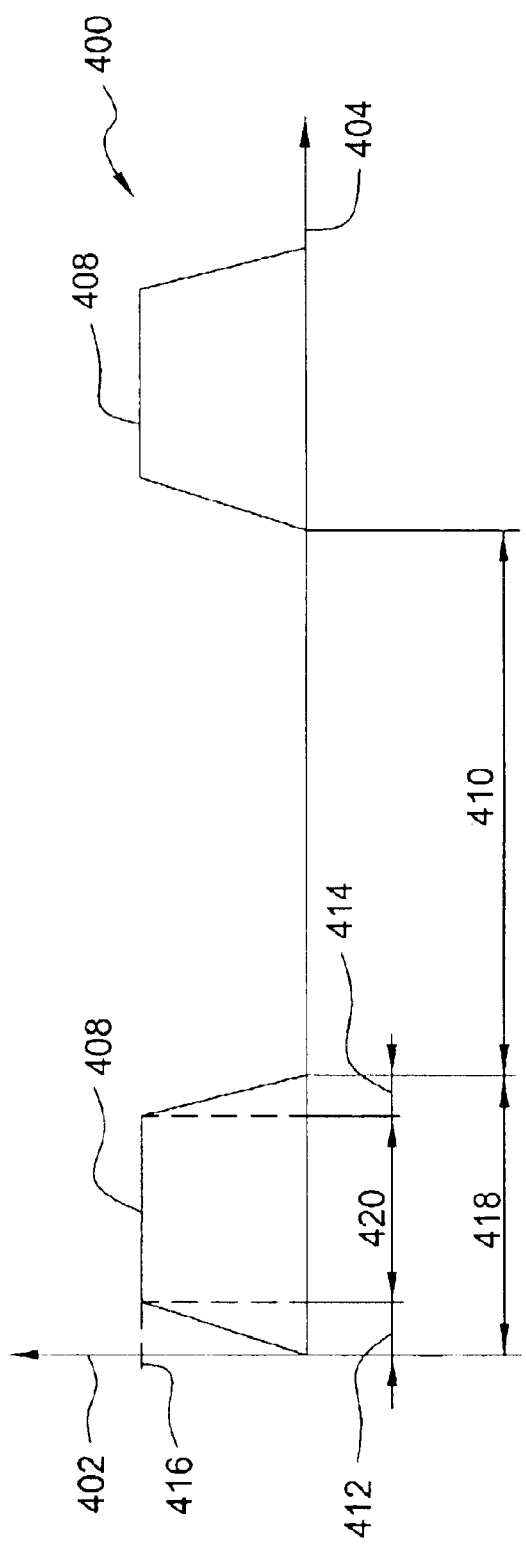
FIG. 4 is an exemplary graph of a pulse of gas produced by the valve of FIG. 1.

FIG. 4 is an exemplary graph of a responsiveness R of the gas valve 100. The term "responsiveness" as used herein relates to a value $R=1/(T_4+T_5)$, where $T_4$ and $T_5$ are time periods needed to stabilize a gas flow through the valve during a pulse of gas at the beginning and at the end of the pulse, respectively. Specifically, a graph 400 depicts a value of a flow of gas through the output port 110 (axis 402) versus time (axis 404). In should be noted that images in FIG. 4 are simplified and not depicted to scale.

In operation, the flow of the gas from a gas channel is cyclically pulsed by the timing slot 306. Each pulse 408 has a duration 418 of $T_1$, and a period 410 between the pulses 408 has a duration of $T_2$. The pulse 408 comprises a leading edge 412 having a duration $T_4$, a trailing edge 414 having a duration $T_5$, and a steady state period 420 related to a flow rate 416. The period 412 relates to transition of the gas flow from the OFF state (i.e., no gas flow) to the ON state (i.e., a gas flow at the rate 416) as defined by a position of the timing slot 106 with respect to the position of an outlet of the gas channel. Similarly, the period 414 relates to the transition from the ON state to the OFF state. The shape of the pulse and the rate of pulsing is referred to herein as the responsiveness profile.

The valve 100 having a greater value of the responsiveness R may produce more pulses 408 over a period time, i.e., may form the pulses of gas at a higher rate. The responsiveness of the valve 100 increases when increases a conductance of a gas path that is collectively formed by a gas channel, the timing slot 306, the valve chamber 108, and the outlet 110. Further, the responsiveness of the valve 100 increases when the internal volume of the gas valve 100 decreases. When the timing slot 306 and the outlets of the gas channels have a form factor wherein the front and back edges are perpendicular to a direction of the reciprocating motion of the selector plate 106, the responsiveness of the gas valve 100 also increases. Tailoring the physical shape of the slot edges enables specific responsiveness profile to be formed.

It should be noted that the valve 100 does not have any limitation for a maximum duration of pulses of gas that the valve produces. A duration of the pulses may be increased, e.g., by decreasing a velocity of the reciprocating motion of the selector plate 106. Also, by modulating the velocity of the plate 106 as the timing slot 306 coincides with a channel, the responsiveness profile may be altered for the leading and trailing edges of the gas pulse. Such modulation can be applied to each channel such that the responsiveness profile may vary for each gas.

Figure 5A:
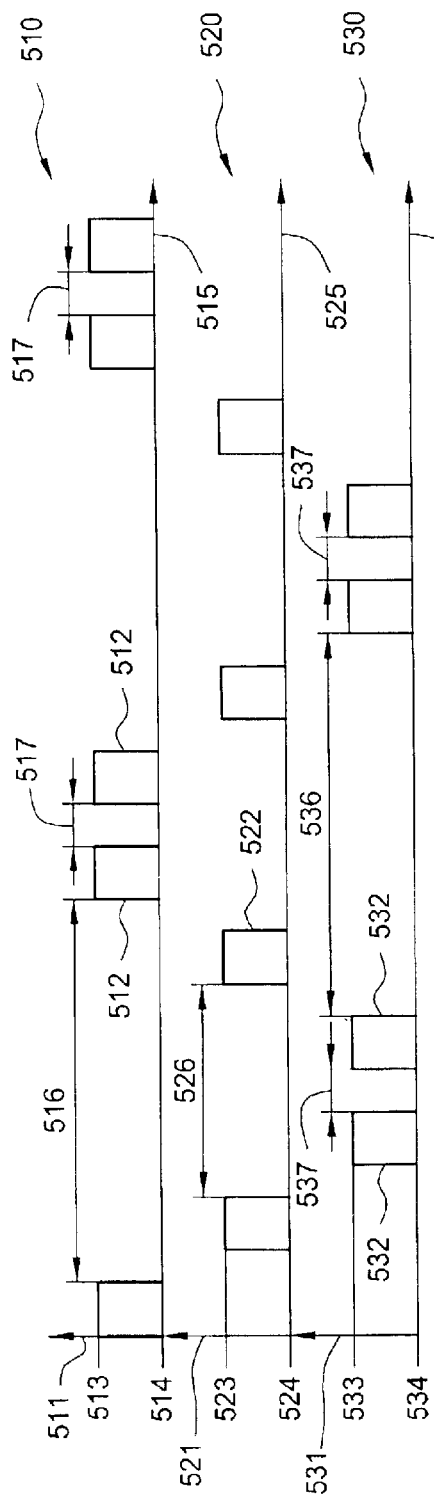
FIGS. 5A–5B are exemplary graphs of illustrative timing diagrams of the gas valve of FIG. 1.
Figure 5B:
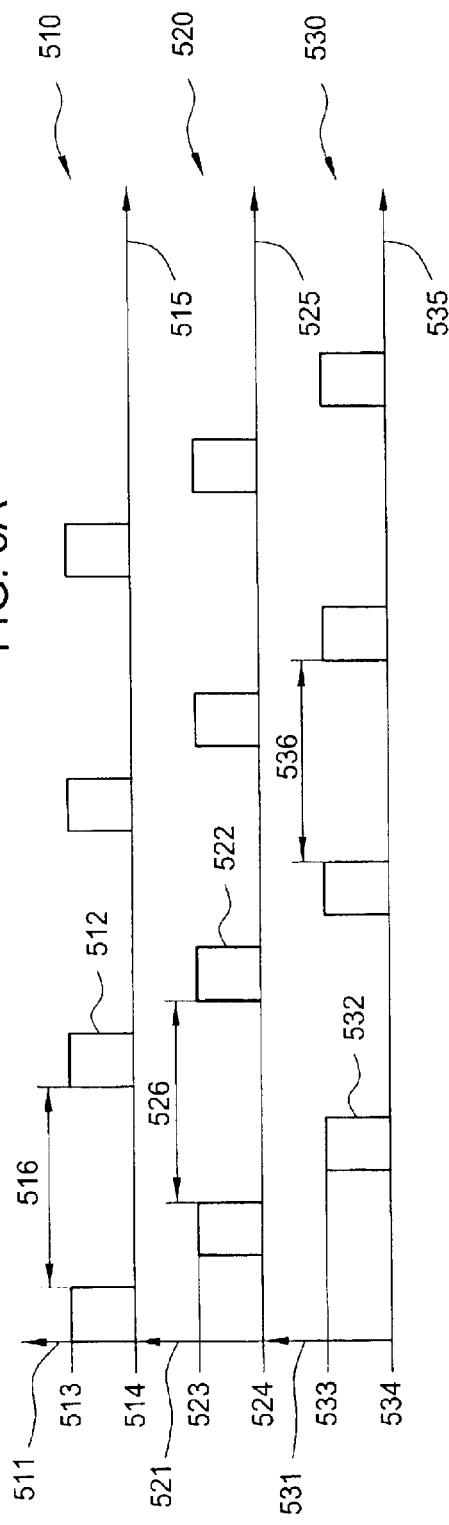

FIGS. 5A and 5B are exemplary graphs of illustrative timing diagrams of pulses of gases produced by the gas valve 100. In FIGS. 5A and 5B, for purposes of clarity, a graphical image of a pulse of gas is reduced to a rectangular shape. Further, the gas channels are assumed to be evenly disposed in the direction of traveling of the timing slot 306 that sequentially passes the outlets of the gas channels starting from the outlet of the channel 114, and velocity of the selector plate 106 is assumed to be constant. Similar to FIG. 4, the images in FIGS. 5A and 5B are depicted not to scale.

FIG. 5A relates to the embodiment having the timing slot 306 that travels over a distance $L_{DT}$, which is greater than $L_1$. FIG. 5A relates to an embodiment when the gas valve 100 comprises a selector plate 106 having the timing slot 306 which width is less than a distance between the adjacent gas channels. In such embodiment, every two pulses of gas from the outer channel 114 or 118 are followed by a pulse of gas from the inner gas channel 116.

FIG. 5B relates to the embodiment having the timing slot 306 that travels over a distance $L_{DT}$, which is in a range from $L_2$ to $L_1$. The width of the timing slot 306 is less than a distance between the adjacent gas channels. In this embodiment, as depicted in FIG. 5C, each pulse of gas from the outer gas channel 114 or 118 is followed by a pulse of gas from the inner channel 116.

Other permissible timing diagrams of pulses produced by the gas valve 100 become readily available to one skilled in the art after reviewing the graphs in FIGS. 5A and 5B.

In FIG. 5A, a first graph 500 depicts a status (axis 511) of a pulse 512 having the states ON (513) and OFF (514) versus time (axis 515) of a first gas delivered to the gas channel 114. Herein, similar to the graph in FIG. 4, the ON state relates to a state of established fluid communication between the respective gas channel and the valve chamber 108 and the OFF state relates to a period between pulses of gas from the same channel. Correspondingly, a second graph 520 depicts a status (axis 521) of a pulse 522 having the states ON (523) and OFF (524) versus time (axis 525) of a second gas delivered to the gas channel 116. Further, a third graph 530 depicts a status (axis 531) of a pulse 532 having the states ON (533) and OFF (534) versus time (axis 535) of a third gas delivered to the gas channel 118. The pulses 512, 522, and 532 have a duration of $T_1$ of the ON state and a duration of $T_2$ of the OFF state.

The periods 516, 526, and 536 relate to the gas cutoff periods having a duration of $T_2$. Similarly, periods 517 and 537 relate to travelling of the timing slot 306 beyond the outlets of the outer gas channels 114 and 118, respectively. In an alternative embodiment, at least one of such periods may have a different duration than the others as defined by a location of the outlets 154 in the direction of traveling of the selector plate 106, e.g., when the distances $\Delta L_{MN}$ vary, or by modulating the velocity of the selector plate 106.

In FIG. 5B, in contrast to FIG. 5A, during a cycle of the reciprocating motion, the timing slot 306 produces only one pulse of gas from each of the gas channels 114, 116, and 118.

In one exemplary embodiment, the outlets of the gas channels and the timing slot 306 have a rectangular form factor. The outlets 154 have a smallest width of 2.5 mm in the direction of traveling of the selector plate 106, a length of 5 mm, and a distance between the outlet of the channel 116 and the outlets of the channels 116 and 118 of 5 mm. In this embodiment, a rectangular timing slot has width of 2.5 mm, a length of 7.5 mm and travels at a velocity of about 100 mm/sec over a distance of about 25 mm. Further, the valve chamber 108 has an internal volume available to a pulsed gas of about 1 to 3 $cm^3$ and the outlet port 110 having a diameter of 5 mm. In this example, the gas valve 100 forms pulses of gas having a duration of about 50 msec with a cutoff period between pulses of gas of about 25 msec. In an alternative exemplary embodiment, when the timing slot 306 has the length of 7.5 mm, the pulses of gas that have a duration of about 100 msec with a duration of overlapping of the pulses from the adjacent channels of about 25 msec.

In other exemplary embodiments, the widths and lengths of the outlets and the timing slot and a distance between the outlets of inner and outer channels were in a ranges of about 0.5 to 10 mm, about 1 to 10 mm, and 1 to 10 mm, respectively, and the velocity of reciprocating motion was in a range of about 1 to 1000 mm/sec. In the exemplary embodiments, the valve 100 produced pulses of gas having a duration of about 50 to 300 msec or longer and had a responsiveness of about 10 to 30 msec or less.

Those skilled in the art will realize that the valve 100 having a single timing slot 306 is illustrative of the invention. Multiple parallel slots that couple to a plurality of gas channels simultaneously are also contemplated to be within the scope of the invention.

Figure 6:
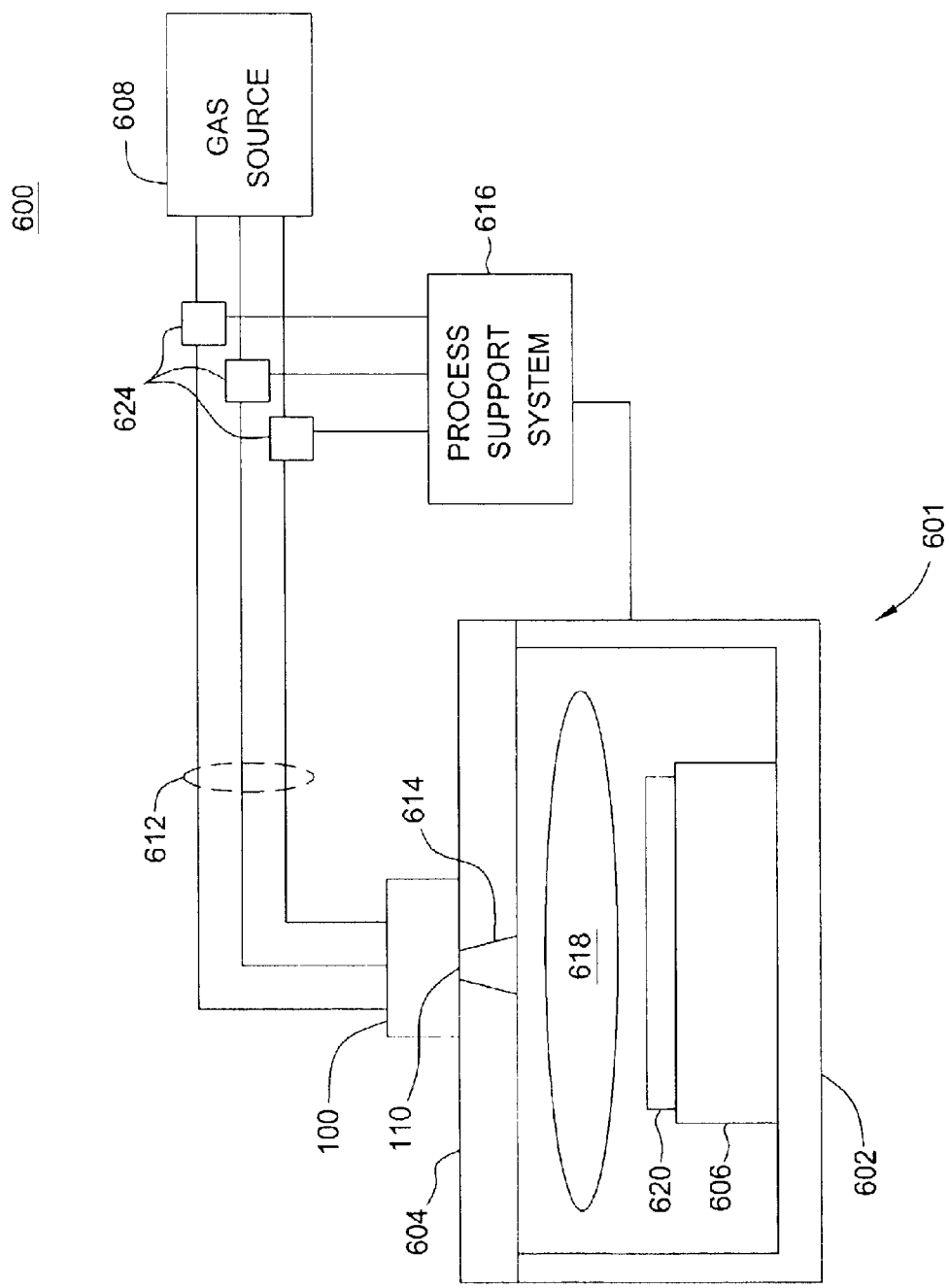
FIG. 6 is a schematic view of one example of an application for the gas valve of FIG. 1 as used in conjunction with a processing chamber of an ALD reactor.

FIG. 6 is a schematic, cross-sectional view of a deposition chamber 601 of a reactor of semiconductor substrate processing system 600 for performing a cyclical deposition process, e.g., an ALD reactor and the like. The chamber 601 comprises a lower portion 602 and an upper portion 604. The lower portion 602 comprises a pedestal 606 to support a substrate 620 (e.g., a silicon (Si) wafer) during processing. The lower portion 602 is coupled to a process support system 616 and the upper portion 604 is coupled to a gas source 608. The system 616 comprises means for controlling a temperature of the substrate, a gas pressure in the chamber 601, power supplies, and the like. The gas source 608 comprises the reactant and inert gases that are used during an ALD process and equipment for regulating a pressure and a flow of each gas.

The upper portion 604 encapsulates a reaction volume 618 above the substrate 620 and comprises a gas valve 100, and an intake port 614. The intake port 614 is used for the introduction of the reactant and purge gases into the deposition chamber 601. The intake port 614 generally is disposed above a center of the pedestal 606 and may comprise a showerhead or nozzle for distributing the gas proximate the substrate 620. The upper portion 604 is coupled to a gas source 608 using a plurality of vacuum-grade gas lines 612 that are chemically resistant to the gases being transported to the chamber 601. In operation, the outlets of the gas source 608 that relate to such gases are coupled to the respective inlet ports of the gas valve 100 using the gas lines 612, each comprising a controlled shutoff valve 624. As described above, the lines 612 are plumbed to the inlet ports of the gas valve 100 in an order the respective gases should be delivered into the deposition chamber 601, with respect to the direction of reciprocating motion of the selector plate 106.

In one embodiment, the gas valve 100 is mounted upon the upper portion 604 in a manner that the outlet port 110 is aligned with the intake port 614. Thus, a volume of a flow path between the outlet 110 and the reaction volume 618 is minimized and a gas conductance of the flow path is maximized. As such, the flow path has a minimal impact on the form factor of the pulses of gas that are formed by the gas valve 100 and delivered into the chamber 601.

The gas valve 100 that is shown and described in reference to FIGS. 1–6 may be adapted for performing various deposition processes such as the ALD process or other form of a cyclical layer deposition process, a pulsed chemical vapor deposition, and the like. The ALD process generally uses, in a form of pulses having a duration of about 50 to 300 msec, reactive precursor, reducing agent, oxidizing agent, catalyst, inert, and the like gases. Each deposited layer may have a thickness less than a monolayer, as a monolayer, or greater than a monolayer of the respective material. Pulsing of the reactant gases may be repeated to deposit a plurality of such layers, each having a highly controlled thickness and forming an integral conformal film of a desired thickness. In exemplary applications, the gas valve 100 may be used in the deposition chamber 601 to form layers of nitrides, oxides, metals, organosilanes, organosiloxanes, dielectrics with either low or high dielectric constant, and the like.

In another exemplary application, when a process, e.g., the ALD process, uses two pulsed reactive precursor gases A and B and one pulsed inert gas C, the gases A and B may be coupled to the inlets of the channels 114 and 118, respectively, and the gas C may be coupled to the inlet of the gas channels 114. In such embodiment, a pulse of the inert gas C always separates pulses of the reactive precursor gas A or B.

In one specific example, the deposition chamber 601 may be used to deposit a tantalum nitride (TiN) film. In this example, the chamber 601 comprises the gas valve 100 having a first inlet (e.g., an inlet of the gas channel 114) coupled to a source of a first reactant gas such as pentadimethylaminotantalum ($Ta(NMe_2)_5$), a third inlet (e.g., an inlet of the gas channel 118) coupled to a source of a second reactant gas such as ammonia ($NH_4$), and a second inlet (e.g., the inlet of the gas channels 116) coupled to a source of a purge gas such as argon (Ar) or helium (He).

Figure 9A:
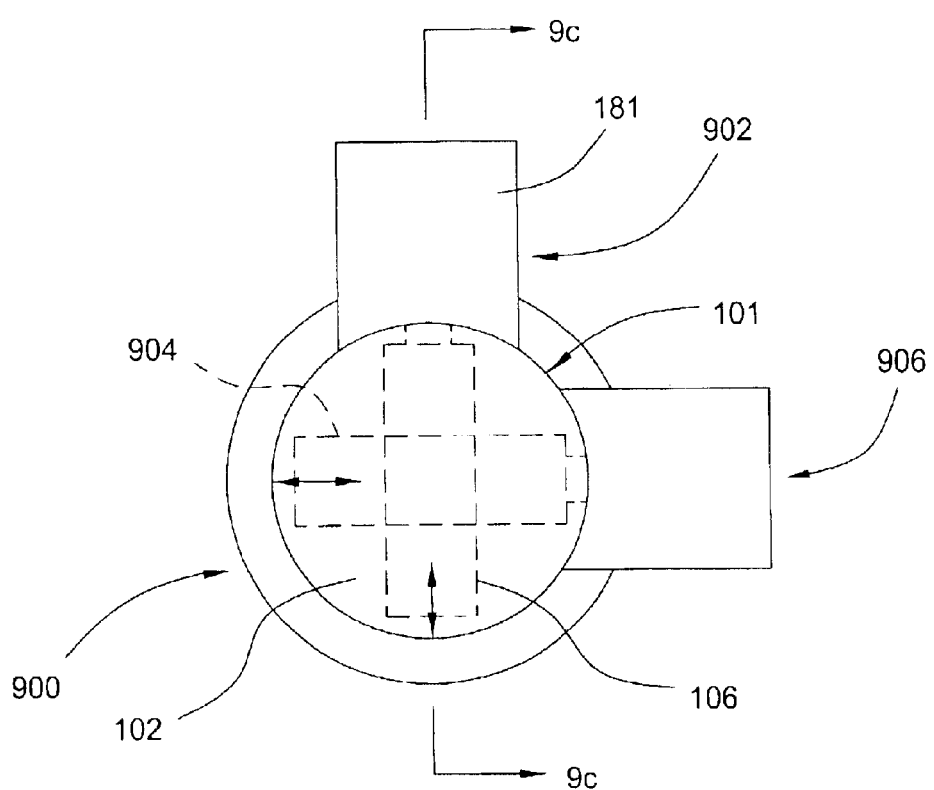
FIGS. 9A–E depicts a sectional and plan views of another embodiment of selector valve.
Figure 9B:
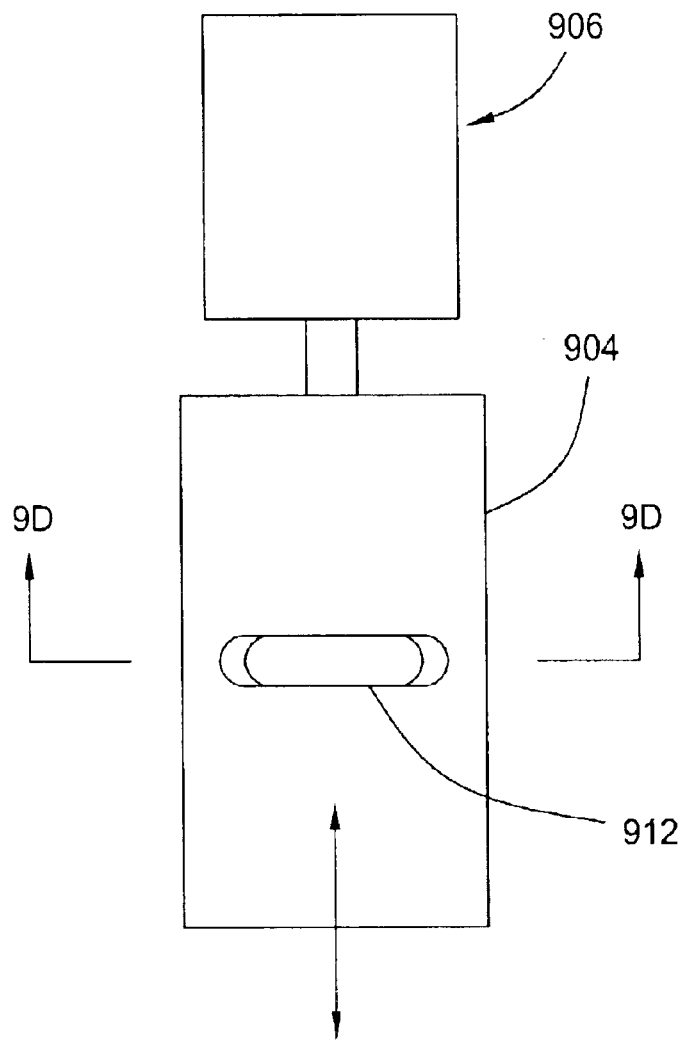
Figure 9D:
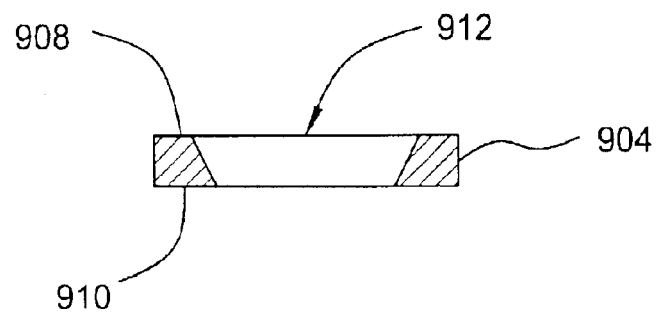
Figure 9C:
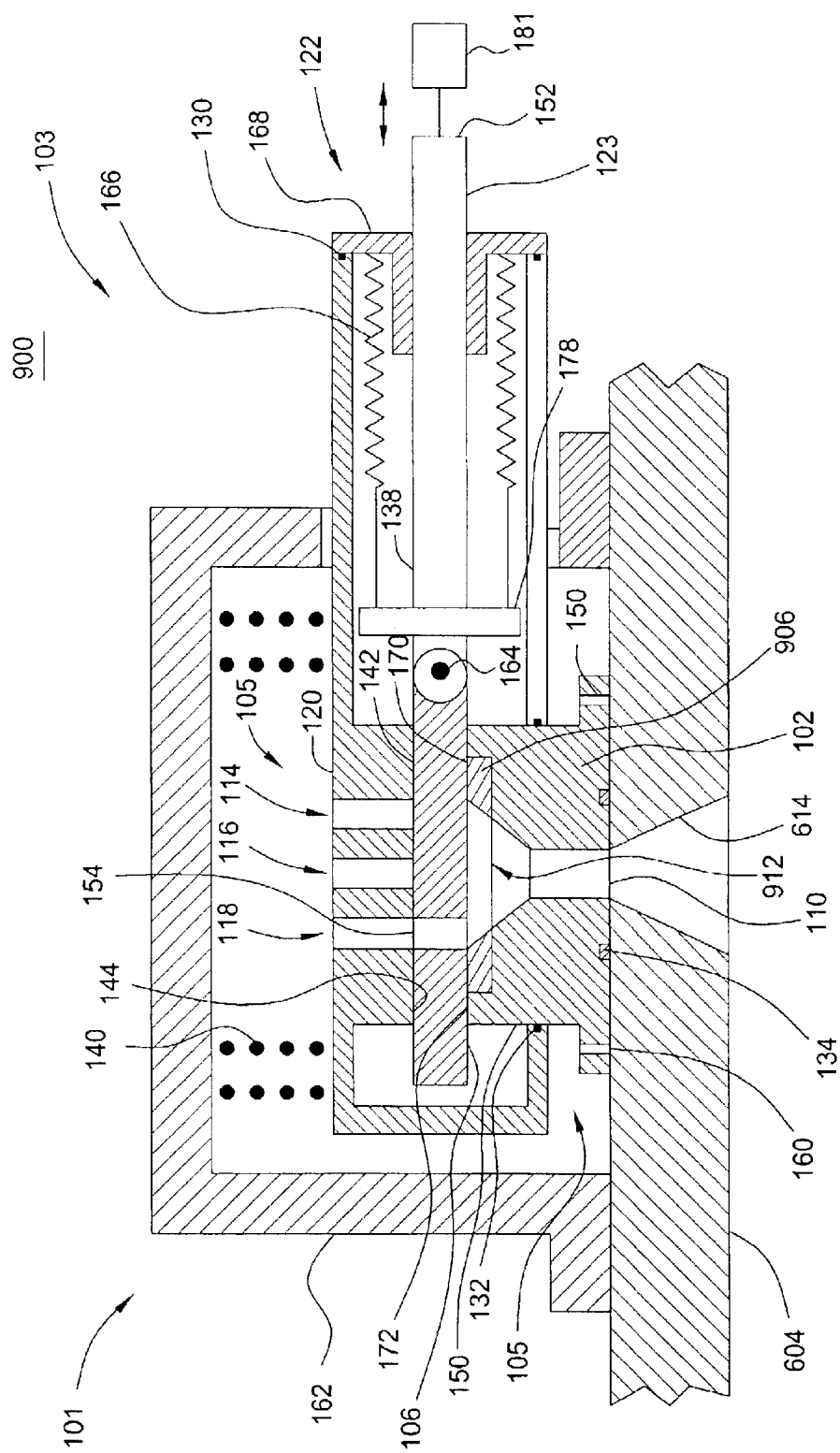
Figure 9E:
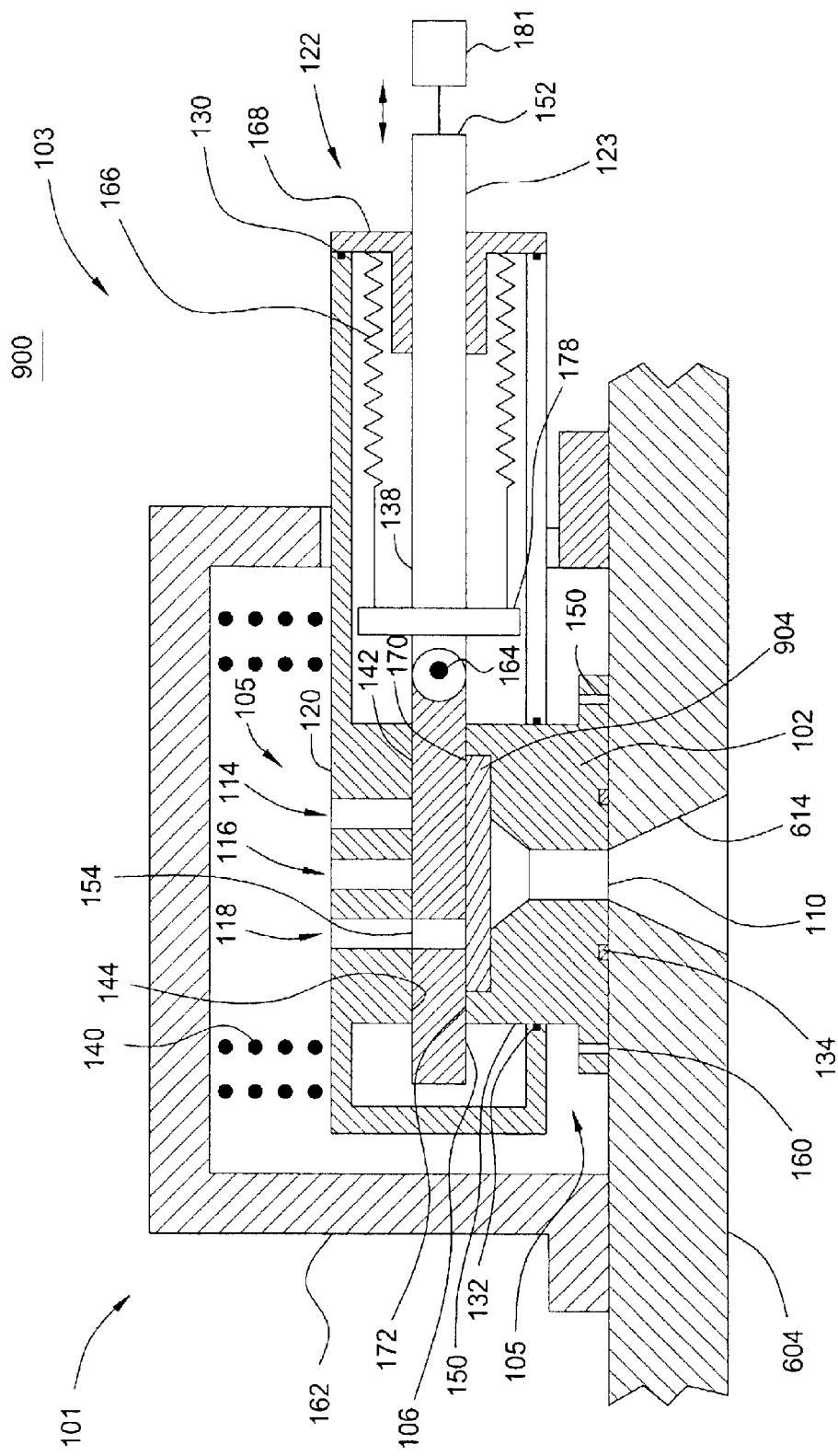

FIGS. 9A–E depicts a sectional and plan views of another embodiment of selector valve 900. The selector valve 900 is similar to the selector valve 100 as described above, except that a valve housing assembly 902 of the selector valve 900 includes a first selector plate 106 and a second selector plate 904 that are adapted to move transversely relative to each other. The second selector plate 904 is driven by a linear actuator 906 which positions a slot 912 that can be selectively aligned with the timing slot 306 of the first selector plate 106 to function as a shut-off valve relative to gas flows through the timing slot 306 from the ports 114, 116 and 118. FIG. 9A illustrates the timing slot 306 opened through the slot 912 the second selector plate 904 while FIG. 9E illustrates the timing slot 306 closed by the second selector plate 904. Thus, only when the slot 912 of the second selector plate 904 is aligned with the timing slot 306 of the first selector plate 106 will gases flow from the inlet ports 114, 116, and 118 to the outlet port 110 of the valve body 102.

As the linear actuator 906 may be driven independently from the linear actuator 181, the ports 114, 116, and 118 may flow gas in any combination. In one example, as the first selector plate 106 reciprocates while the second selector plate 904 remains in an open position, gases will sequentially flow from the ports 114, 116 and 118 in a repeating sequence of 114-116-118-116-114-116-118-116, ect. In another example, as the first selector plate 106 reciprocates and the second selector plate 904 is cycled between in an open and closed position in response to the travel direction of the first selector plate 106, ports may open in a repeating sequence of 114-116-118-114-116-118, etc. Alternatively, the selector plates 106 and 904 may be positioned to flow gas from the ports 114, 116 and 118 in any combination.

The valve body 902 generally includes a groove 920 that guides the second selector plate 904. The second selector plate 904 is generally has a first surface 908 that seals with the first selector plate 106 and a second surface 910 that seals with the groove 920 of the valve body 902 in a manner similar to the valve body 102 described above.

Although the forgoing discussion referred to a gas valve for pulsing of gases used a semiconductor substrate processing system, other applications wherein the pulsed gases are employed can benefit from the invention. The invention can find a use in various apparatuses for perform accurate dosing or rapid pulsing of the gases and wherein the design parameters of the inventive gas valve may be adjusted to achieve acceptable characteristics by those skilled in the art by utilizing the teachings disclosed herein without departing from the spirit of the invention.

While foregoing is directed to the illustrative embodiment of the present invention, other and further embodiments of the invention may be devised without departing from the basic scope thereof, and the scope thereof is determined by the claims that follow.

What is claimed is:

1. A gas valve for pulsing a gas, comprising:
   a housing assembly having at least one inlet port and an outlet port; and
   a selector plate mounted in said housing assembly, comprising at least one timing slot, wherein reciprocating motion of the selector plate periodically couples the at least one inlet port to the outlet port through the timing slot.

2. The gas valve of claim 1, wherein the at least one timing slot and at least one inlet port coincide, partially or entirely, during said reciprocating motion.

3. The gas valve of claim 1, wherein the at least one timing slot has a width that is less than a distance between two adjacent inlet ports.

4. The gas valve of claim 1, wherein the at least one timing slot has a width that is equal to or greater than a distance between two adjacent inlet ports.

5. The gas valve of claim 1, wherein the at least timing slot has a substantially rectangular form factor with a longest width positioned orthogonal to a direction of said reciprocating motion.

6. The gas valve of claim 1 further comprising an actuator assembly for engaging the selector plate in said reciprocating motion.

7. The gas valve of claim 1, further comprising a bias member located between a supporting bracket and the housing assembly to bias the selector plate against the housing assembly.

8. The gas valve of claim 7, wherein the bias member exerts an expanding elastic force.

9. The gas valve of claim 7, wherein the actuator assembly defines the linear position of the selector plate.

10. The gas valve of claim 1, wherein the selector plate forms vacuum-tight couplings within the housing assembly.

11. The gas valve of claim 1, wherein the housing has an internal volume for the gas between the selector plate and the outlet port of about 1 to 3 $cm^3$.

12. A system for processing semiconductor wafers comprising:
    a processing chamber;
    a source of at least one pressurized reactant or inert gas; and
    a gas valve for pulsing a gas, comprising:
    a housing assembly having at least one inlet port and an outlet port; and
    a selector plate mounted in said housing assembly, comprising at least one timing slot, wherein reciprocating motion of the selector plate periodically couples the at least one inlet port to the outlet port through the timing slot.

13. The system of claim 12, wherein the at least one timing slot and at least one inlet port coincide, partially or entirely, during said reciprocating motion.

14. The system of claim 12, wherein the at least one timing slot has a width that is less than a distance between two adjacent inlet ports.

15. The system of claim 12, wherein the at least one timing slot has a width that is equal to or greater than a distance between two adjacent inlet ports.

16. The system of claim 12, wherein the at least timing slot has a substantially rectangular form factor with a longest width positioned orthogonal to a direction of said reciprocating motion.

17. The system of claim 12 further comprising an actuator assembly for engaging the selector plate in said reciprocating motion.

18. The system of claim 12, further comprising a bias member located between a supporting bracket and the housing assembly to bias the selector plate against the housing assembly.

19. The system of claim 18, wherein the bias member exerts an expanding elastic force.

20. The system of claim 18, wherein the actuator assembly defines the linear position of the selector plate.

21. The system of claim 1, wherein the selector plate forms vacuum-tight couplings within the housing assembly.

22. The system of claim 1, wherein the housing has an internal volume for the gas between the selector plate and the outlet port of about 1 to 3 $cm^3$.

* * * * *